United States Patent
Kim et al.

(10) Patent No.: US 11,939,505 B2
(45) Date of Patent: Mar. 26, 2024

(54) SILICON NITRIDE FILM ETCHING COMPOSITION AND ETCHING METHOD USING THE SAME

(71) Applicant: ENF TECHNOLOGY CO., LTD., Yongin-si (KR)

(72) Inventors: Dong Hyun Kim, Yongin-si (KR); Hyeon Woo Park, Yongin-si (KR); Sung Jun Hong, Yongin-si (KR); Myung Ho Lee, Hwaseong-si (KR); Myung Geun Song, Yongin-si (KR); Hoon Sik Kim, Yongin-si (KR); Jae Jung Ko, Seoul (KR); Myong Euy Lee, Yongin-si (KR); Jun Hyeok Hwang, Seoul (KR)

(73) Assignee: ENF Technology Co., Ltd., Yongin-Si (KR)

( * ) Notice: Subject to any disclaimer, the term of this patent is extended or adjusted under 35 U.S.C. 154(b) by 221 days.

(21) Appl. No.: 17/446,414

(22) Filed: Aug. 30, 2021

(65) Prior Publication Data

US 2022/0089952 A1 Mar. 24, 2022

(30) Foreign Application Priority Data

Sep. 21, 2020 (KR) .......... 10-2020-0121551

(51) Int. Cl.
*C09K 13/06* (2006.01)
*C23F 1/02* (2006.01)
*C23F 1/44* (2006.01)
*H01L 21/3213* (2006.01)

(52) U.S. Cl.
CPC .............. *C09K 13/06* (2013.01); *C23F 1/02* (2013.01); *C23F 1/44* (2013.01); *H01L 21/32134* (2013.01)

(58) Field of Classification Search
None
See application file for complete search history.

(56) References Cited

U.S. PATENT DOCUMENTS

| | | | |
|---|---|---|---|
| 2017/0321121 A1* | 11/2017 | Yoo | H01L 21/31111 |
| 2019/0390110 A1* | 12/2019 | Kim | C09K 13/08 |
| 2020/0157423 A1* | 5/2020 | Bilodeau | C23F 1/14 |

FOREIGN PATENT DOCUMENTS

| | | | | |
|---|---|---|---|---|
| JP | 2018-182312 A | | 11/2018 | |
| JP | 2018182312 A | * | 11/2018 | ............. C09K 13/06 |
| KR | 10-2013-0016797 A | | 2/2013 | |
| KR | 20130016797 A | * | 2/2013 | |
| KR | 10-2005963 B1 | | 7/2019 | |
| KR | 20190142010 A | * | 12/2019 | |
| KR | 10-2020-0039801 A | | 4/2020 | |
| KR | 10-2020-0071644 A | | 6/2020 | |
| KR | 20200126500 A | * | 11/2020 | |

OTHER PUBLICATIONS

Notice of Allowance in Korean Application No. 10-2020-0121551 dated Sep. 30, 2021 in 2 pages.

* cited by examiner

*Primary Examiner* — Allan W. Olsen
(74) *Attorney, Agent, or Firm* — Knobbe, Martens, Olson & Bear LLP

(57) ABSTRACT

Provided are a silicon nitride film etching composition, a method of etching a silicon nitride film using the same, and a manufacturing method of a semiconductor device. Specifically, a silicon nitride film may be stably etched with a high selection ratio relative to a silicon oxide film, and when the composition is applied to an etching process at a high temperature and a semiconductor manufacturing process, not only no precipitate occurs but also anomalous growth in which the thickness of the silicon oxide film is rather increased does not occur, thereby minimizing defects and reliability reduction.

14 Claims, No Drawings

SILICON NITRIDE FILM ETCHING COMPOSITION AND ETCHING METHOD USING THE SAME

CROSS-REFERENCE TO RELATED APPLICATIONS

This application claims priority under 35 U.S.C. § 119 to Korean Patent Application No. 10-2020-0121551, filed on Sep. 21, 2020, in the Korean Intellectual Property Office, the disclosure of which is incorporated herein by reference in its entirety.

TECHNICAL FIELD

The following disclosure relates to a silicon nitride film etching composition, an etching method of a silicon nitride film using the same, and a manufacturing method of a semiconductor device.

BACKGROUND

A silicon oxide film ($SiO_2$) and a silicon nitride film ($SiN_x$) are a representative insulating film used in a semiconductor manufacturing process. Of the two, the silicon oxide film is used as a cap layer, a spacer layer, or a hard mask layer in a semiconductor device. The silicon nitride film and the silicon nitride film may be used alone or as a laminate in which one or more layers of silicon oxide film and one or more layers of silicon nitride film are alternately laminated. When manufacturing semiconductors, the silicon nitride layers and silicon oxide layers may be etched.

The disclosure of this section is to provide background information relating to the present disclosure. Applicant does not admit that any information contained in this section constitutes prior art.

SUMMARY

An embodiment of the present invention is directed to providing a silicon nitride film etching composition which, of a silicon nitride film and a silicon oxide film being laminated, selectively etches the silicon nitride film and allows stable etching for the silicon nitride film with securement of etching stability.

Specifically, it is intended to provide a silicon nitride film etching composition which may maintain a high etch rate for a silicon nitride film and minimize damage and an etch rate for a silicon oxide film to etch the silicon nitride film with a high selection ratio.

Specifically, it is intended to provide a silicon nitride film etching composition which may suppress abnormal growth of a silicon oxide film.

Specifically, it is intended to provide a silicon nitride film etching composition which does not produce precipitates during repeated etching.

Another embodiment of the present invention is directed to providing a method of etching a silicon nitride film with a high selection ratio using the silicon nitride film etching composition described above and a manufacturing method of a semiconductor device.

In one general aspect, a silicon nitride film etching composition includes: a phosphoric acid, quaternary ammonium silicate, a silicon compound represented by the following Chemical Formula 1, and a residual amount of water:

[Chemical Formula 1]

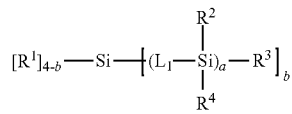

wherein $R^1$ is $C_{1\text{-}20}$ aminoalkyl and —$CH_2$— of the alkyl may be replaced with —N(R')— or —O— in which R' is hydrogen, $C_{1\text{-}7}$ alkyl, $C_{1\text{-}7}$ hydroxyalkyl, or $C_{1\text{-}7}$ aminoalkyl;

$R^2$ to $R^4$ are independently of one another hydrogen, a halogen, amino, cyano, hydroxy, $C_{1\text{-}20}$ alkoxy, $C_{1\text{-}20}$ alkyl, $C_{1\text{-}20}$ aminoalkyl, or

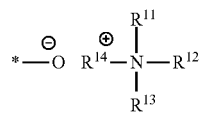

in which $R^{11}$ to $R^{14}$ are independently of one another hydrogen, $C_{1\text{-}20}$ alkyl, or $C_{1\text{-}20}$ hydroxyalkyl;

$L_1$ is $C_{1\text{-}20}$ alkylene and —$CH_2$— of the alkylene may be replaced with —O—, —NR"—, or a combination thereof in which R" is hydrogen or $C_{1\text{-}7}$ alkyl;

a is an integer selected from 0 to 10; and b is an integer selected from 1 to 3.

The silicon nitride film etching composition according to an example embodiment of the present invention may include the silicon compound of Chemical Formula 1 wherein $R^1$ is $C_{1\text{-}7}$ aminoalkyl and —$CH_2$— of the alkyl may be replaced with —NR'— in which R' is hydrogen or $C_{1\text{-}3}$ alkyl.

The silicon nitride film etching composition according to an example embodiment of the present invention may include the silicon compound of Chemical Formula 1 wherein $R^1$ is $C_{1\text{-}7}$ aminoalkyl, and $R^2$ to $R^4$ are independently of one another hydrogen, a halogen, amino, hydroxy, $C_{1\text{-}7}$ alkoxy, $C_{1\text{-}7}$ alkyl, $C_{1\text{-}7}$ aminoalkyl, or

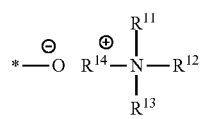

in which $R^{11}$ to $R^{14}$ are independently of one another hydrogen, $C_{1\text{-}7}$ alkyl, or $C_{1\text{-}7}$ hydroxyalkyl, and $L^1$ is $C_{1\text{-}7}$ alkylene and —$CH_2$— of the alkylene may be replaced with —O—.

The silicon nitride film etching composition according to an example embodiment of the present invention may include the silicon compound of Chemical Formula 1 wherein $R^1$ is $C_{1\text{-}7}$ aminoalkyl and —$CH_2$— of the alkyl may be replaced with —NR'— in which R' is hydrogen or methyl; $R^2$ to $R^4$ are independently of one another hydrogen, a halogen, hydroxy, or $C_{1\text{-}7}$ alkoxy; $L^1$ is —O—; and a is an integer of 0 or 1.

In the silicon nitride film etching composition according to an example embodiment of the present invention, the quaternary ammonium silicate may be one or a mixture of two or more selected from tetramethylammonium silicate, tetraethylammonium silicate, tetrapropylammonium silicate, tetrabutylammonium silicate, and the like.

The silicon nitride film etching composition according to an example embodiment of the present invention may include 60 to 95 wt % of the phosphoric acid, 0.01 to 5.00 wt % of the quaternary ammonium silicate, 0.01 to 5.00 wt % of the silicon compound represented by Chemical Formula 1, and a residual amount of water, with respect to the total weight.

The silicon nitride film etching composition according to an example embodiment of the present invention may include 1 to 300 parts by weight of the quaternary ammonium silicate, based on 100 parts by weight of the silicon compound represented by Chemical Formula 1, while satisfying the wt % described above simultaneously.

The silicon nitride film etching composition according to an example embodiment of the present invention may further include an inorganic acid, a derivative thereof, or a combination thereof.

The silicon nitride film etching composition according to an example embodiment of the present invention may further include an alcoholic solvent.

The silicon nitride film etching composition according to an example embodiment of the present invention may have a silicon nitride film/oxide film etch selection ratio of 500 or more.

The silicon nitride film etching composition according to an example embodiment of the present invention may have an etch rate for the silicon nitride film of 20 to 500 Å/min and an etch rate for the silicon oxide film of 0 to 0.5 Å/min.

The silicon nitride film etching composition according to an example embodiment of the present invention may have an etch rate drift of the silicon nitride film after a repeated etching process satisfying the following Relation 1:

$$\Delta ERD_{SiNx} \leq 1\% \qquad \text{[Relation 1]}$$

wherein $\Delta ERD_{SiNx}$ is an etch rate drift relative to an initial etch rate for a silicon nitride film.

In another general aspect, a method of selectively etching a silicon nitride film as compared with a silicon oxide film using the silicon nitride film etching composition is provided.

In still another general aspect, a manufacturing method of a semiconductor device includes an etching process performed using the silicon nitride film etching composition described above.

Other features and aspects will be apparent from the following detailed description of embodiments and the claims.

DETAILED DESCRIPTION OF EMBODIMENTS

Hereinafter, the silicon nitride film etching composition according to embodiments of the present invention will be described in detail. Here, technical terms and scientific terms used in the present specification have the general meaning understood by those skilled in the art to which the present invention pertains unless otherwise defined, and a description for the known function and configuration which may unnecessarily obscure the gist of the present invention will be omitted in the following description.

The singular form used in the present specification may be intended to also include a plural form, unless otherwise indicated in the context.

In addition, units used in the present specification without particular mention are based on weights, and as an example, a unit of % or ratio refers to a wt % or a weight ratio and wt % refers to wt % of any one component in a total composition, unless otherwise defined.

In addition, the numerical range used in the present specification includes all values within the range including the lower limit and the upper limit, increments logically derived in a form and span in a defined range, all double limited values, and all possible combinations of the upper limit and the lower limit in the numerical range defined in different forms. Unless otherwise defined in the specification of the present invention, values which may be outside a numerical range due to experimental error or rounding of a value are also included in the defined numerical range.

The term of the present specification "comprise" is an open-ended description having a meaning equivalent to the term such as "is/are provided", "contain", "have", or "is/are characterized", and does not exclude elements, materials or processes which are not further listed.

The term of the present specification "etch selection ratio ($E_{SiNx}/E_{SiO2}$)" refers to a ratio of an etch rate of a silicon nitride film ($E_{SiNx}$) to an etch rate of a silicon oxide film ($E_{SiO2}$). In addition, when the etch rate of a silicon oxide film is close to zero or has a high numerical value of the etch selection ratio, it means that a silicon nitride film may be selectively etched.

The term of the present specification "change in etch selection ratio" refers to an absolute value of a difference between an etch selection ratio and an initial etch selection ratio, when an etching process is repeatedly performed twice or more using the same silicon nitride film etching composition.

The term of the present specification "etch rate drift ($\Delta ERD$)" refers to a rate of change of an etch rate relative to an initial etch rate, when an etching process is repeatedly performed twice or more using the same silicon nitride film etching composition. Generally, as an etching process is repeatedly performed, etching performance, that is, an etch rate tends to be decreased, and thus, it is defined as a drift, and the rate of change is also interpreted as having the same meaning, of course. Specifically, the etch rate drift may be derived from the following Equation 1:

$$\Delta ERD = [1 - \{(\text{etch rate when repeatedly performing etching process n times or more})/(\text{initial etch rate})\}] \times 100 \qquad \text{[Relation 1]}$$

The term of the present specification "quaternary ammonium silicate" may include a structural unit formed by one silicon atom (Si) surrounded by four oxygen atoms (O).

The term of the present specification "halogen" or "halo" refers to a fluorine, chlorine, bromine, or iodine atom.

The term of the present specification "aminoalkyl" refers to an alkyl group containing an amino group (*—NR'R"). Herein, R' and R" are independently of each other hydrogen or $C_{1-20}$ alkyl.

The term of the present specification "hydroxyalkyl" refers to an alkyl group containing a hydroxyl group (*—OH).

A silicon nitride film and a silicon oxide film are representative insulating films used in a semiconductor manufacturing process. A silicon nitride film may be laminated on a surface such as a silicon oxide film, a polysilicon film, and a silicon wafer as a thin film mainly by a chemical vapor deposition (CVD) process, and the silicon nitride film formed as such may be removed by an etching process.

For etching of the silicon nitride film, an aqueous phosphoric acid solution formed of a high-purity phosphoric acid and deionized water at a high temperature of about 160° C.

is used. However, since the aqueous phosphoric acid solution has a low etch selection ratio of the silicon nitride film relative to the silicon oxide film of 30 or less, it is difficult to apply the aqueous phosphoric acid solution to a lamination structure of the silicon nitride film and the silicon oxide film. In addition, since the silicon nitride film etching composition including a phosphoric acid is consistently concentrated by evaporation of moisture at a high temperature to affect the etch ratio of the nitride film and the oxide film, pure water (deionized water) should be consistently supplied. However, even in the case in which an amount of pure water to be supplied is changed a little, defects may be caused when removing the silicon nitride film.

For improving an etch selection ratio of the silicon nitride film to the silicon oxide film, a silicon nitride film etching composition in which a silicic acid is dissolved in a phosphoric acid may be used. However, the silicon nitride film etching composition produces precipitates during etching, and the thickness of the silicon oxide film is rather increased, which is an anomalous growth, and thus, it is difficult to apply the composition to a process.

Besides, a method of using a silicon compound containing an oxygen atom directly bonded to silicon to control an etch selection ratio may be used, but the etch selection ratio of the silicon nitride film relative to the silicon oxide film is not high and may produce precipitates, and thus, development of an etching composition to etch the silicon nitride film at a high selection ratio without occurrence of precipitates is needed.

Typical wet etching provides a low etch selection ratio of a silicon nitride film to a silicon oxide film and an etch selection ratio changed when using an etchant several times. In addition, during an etching process, precipitates occur and a thickness of a silicon oxide film is increased.

Thus, the present inventors intensively studied a silicon nitride film etching composition having a further improved etch selection ratio. As a result, the present inventors confirmed that when a treatment is performed with a phosphoric acid-based etchant composition including a combination of silicon compounds having different structural characteristics from each other as an additive, not only stable etching with a high selection ratio for a silicon nitride film to a silicon oxide film is allowed, but also occurrence of precipitates is prevented and anomalous growth of other films including a silicon oxide film present around the silicon nitride film is remarkably decreased.

In addition, the present inventors found that since the silicon nitride film etching composition according to embodiments of the present invention shows a high selection ratio for a silicon nitride film to a silicon oxide film and shows high stability even during etching at a high temperature of 200° C. or higher, an etch rate and an etch selection ratio for a silicon nitride film may be maintained for a long time in spite of an increased treatment time and the increased number of treatment, thereby completing embodiments of the present invention.

Hereinafter, the silicon nitride film etching composition according to embodiments of the present invention will be described in detail.

The silicon nitride film etching composition according to an example embodiment of the present invention, which is an etching composition having a high selection ratio for a silicon nitride film relative to a silicon oxide film, is a phosphoric acid-based etchant composition including a combination of silicon compounds having different structural characteristics from each other as an additive.

Specifically, the silicon nitride film etching composition according to an example embodiment of the present invention may include a mixture of quaternary ammonium silicate which is a first silicon compound and a silicon compound represented by the following Chemical Formula 1 which is a second silicon compound as an additive. That is, the silicon nitride film etching composition according to embodiments of the present invention may include a phosphoric acid, quaternary ammonium silicate, a silicon compound represented by the following Chemical Formula 1, and a residual amount of water:

[Chemical Formula 1]

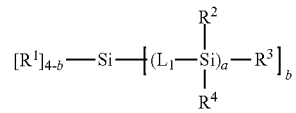

wherein $R^1$ is $C_{1-20}$ aminoalkyl and —$CH_2$— of the alkyl may be replaced with —NR'— or —O— in which R' is hydrogen, $C_{1-7}$ alkyl, $C_{1-7}$ hydroxyalkyl, or $C_{1-7}$ aminoalkyl;

$R^2$ to $R^4$ are independently of one another hydrogen, a halogen, amino, cyano, hydroxy, $C_{1-20}$ alkoxy, $C_{1-20}$ alkyl, $C_{1-20}$ aminoalkyl, or

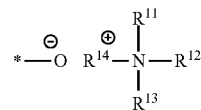

in which $R^{11}$ to $R^{14}$ are independently of one another hydrogen, $C_{1-20}$ alkyl, or $C_{1-20}$ hydroxyalkyl;

$L_2$ is $C_{1-20}$ alkylene and —$CH_2$— of the alkylene may be replaced with —O—, —NR"—, or a combination thereof in which R" is hydrogen or $C_{1-7}$ alkyl;

a is an integer selected from 0 to 10; and b is an integer selected from 1 to 3.

Since the silicon nitride film etching composition according to embodiments of the present invention satisfies the composition described above, improved etching stability may be implemented. Here, the etching stability may refer to not only a stable etch rate for a silicon nitride film which is a subject to be etched but also a low reduction rate in an etch selection ratio. In addition, it may refer to, after an etching process at a high temperature, no anomalous growth occurrence of a silicon oxide film without causing precipitate occurrence.

The silicon nitride film etching composition according to an example embodiment of the present invention may include the silicon compound of Chemical Formula 1 wherein $R^1$ is aminoalkyl having a structure of $R^a{}_2N$—$(CH_2)_n$— (n: 1 to 7, $R^a$: $C_{1-7}$ alkyl) and one —$CH_2$— of —$(Ch2)n_{-2})_n$- of $R^1$ may be replaced with —NR'— in which R' is hydrogen or $C_{1-3}$ alkyl.

The silicon nitride film etching composition according to an example embodiment of the present invention may include the silicon compound of Chemical Formula 1 wherein $R^2$ to $R^4$ are independently of one another hydrogen, a halogen, amino, hydroxy, $C_{1-7}$ alkoxy, $C_{1-7}$ alkyl, $C_{1-7}$ aminoalkyl, or

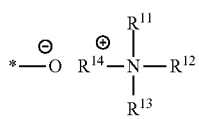

in which $R^{11}$ to $R^{14}$ are independently of one another hydrogen, $C_{1-7}$ alkyl, or $C_{1-7}$ hydroxyalkyl; and $L^1$ is $C_{1-7}$ alkylene and one methylene group (—$CH_2$—) of the alkylene may be replaced with an ether group (—O—).

The silicon nitride film etching composition according to an example embodiment of the present invention may include the silicon compound of Chemical Formula 1 wherein $R^1$ is aminoalkyl having a structure of $R^a{}_2N$—$(CH_2)_n$— (n: 1 to 7, $R^a$: $C_{1-7}$ alkyl) and one —$CH_2$— of —$(CH_2)_n$— of $R^1$ may be replaced with —NR'— in which R' is hydrogen or methyl; $R^2$ to $R^4$ are independently of one another hydrogen, a halogen, hydroxy, or $C_{1-7}$ alkoxy; $L^1$ is an oxygen atom (—O—); and a is an integer of 0 or 1.

The silicon nitride film etching composition according to an example embodiment of the present invention may include the silicon compound of Chemical Formula 1 wherein $R^1$ is aminoalkyl having a structure of $R^a{}_2N$—$(CH_2)_n$— (n: 1 to 3, $R^a$: $C_{1-7}$ alkyl) or a substituent having a structure of $R^a{}_2N$—$(CH_2)_m NH(CH_2)_n$— (m: 1 to 3, n: 1 to 3, $R^a$: $C_{1-7}$ alkyl); $R^2$ to $R^4$ are independently of one another a halogen, hydroxy, or $C_{1-3}$ alkoxy; $L^1$ is an oxygen atom (—O—); and a is an integer of 0 or 1.

In the silicon nitride film etching composition according to an example embodiment of the present invention, in Chemical Formula 1, b may be an integer of 2 or 3.

In the silicon nitride film etching composition according to an example embodiment of the present invention, a non-limiting example of the silicon compound may include one or two or more nitrogen-containing silicon compounds selected from N,N-dimethylaminopropyltrimethoxysilane, N,N-dimethylaminopropyltriethoxysilane, N,N-diethylaminopropyltrimethoxysilane, N,N-diethylaminopropyltriethoxysilane, N-methyl-3-(trimethoxysilyl)propylamine, N-methyl-3-(triethoxysilyl)propylamine, bis(3-(methylamino)propyl)trimethoxysilane, bis(3-(methylamino)propyl)triethoxysilane, bis[3-(trimethoxysilyl)propyl]amine, bis[3-(triethoxysilyl) propyl]amine, 3-[bis(2-hydroxyethyl)amino]propyl-triethoxysilane, 3-aminopropyltrimethoxysilane, 3-aminopropyltriethoxysilane, 3-aminopropyltrihydroxysilane, 3-aminopropyldiethoxymethylsilane, 3-aminopropyldimethoxymethylsilane, 3-(2-aminoethylamino)-propyl-dimethoxymethylsilane, 3-(2-aminoethylamino)propyltrimethoxysilane, 3-(2-aminoethylamino)propyltriethoxysilane, [3-(6-aminohexylamino)propyl]trimethoxysilane, (3-isocyanatopropyl) trimethoxysilane, (3-isocyanatopropyl)triethoxysilane, and the like.

In the silicon nitride film etching composition according to an example embodiment of the present invention, the quaternary ammonium silicate may be one or a mixture of two or more selected from tetramethylammonium silicate, tetraethylammonium silicate, tetrapropylammonium silicate, tetrabutylammonium silicate, and the like.

As an example, the quaternary ammonium silicate may include a linear alkyl group.

As an example, the quaternary ammonium silicate may implement a higher etch selection ratio with the fewer carbon atoms of an alkyl group.

Specifically, the silicon nitride film etching composition according to embodiments of the present invention passivates a silicon oxide film, thereby suppressing corrosion and damage of the silicon oxide film during an etching process of a silicon nitride film. Furthermore, the silicon nitride film etching composition according to embodiments of the present invention is moved to the surface of the silicon oxide film and then adsorbed, thereby effectively suppressing the anomalous growth of the silicon oxide film simultaneously with protecting the surface of the silicon oxide film.

In addition, the silicon nitride film etching composition according to embodiments of the present invention includes a high content of a phosphoric acid, but may increase stability of the phosphoric acid to stably maintain a high selection ratio to the silicon nitride film and provide an advantage during an etching process at a high temperature.

The silicon nitride film etching composition according to an example embodiment of the present invention has a high etch selection ratio to the silicon nitride film. In addition, an etch rate drift is low, so that a more stable etching process may be provided to significantly decrease a defect rate. In addition, the silicon nitride film etching composition is stable even at a high temperature.

An etching process using the silicon nitride film etching composition according to an example embodiment of the present invention may be performed at a process temperature of 100° C. or higher, specifically 100 to 500° C., and more specifically 150 to 300° C. As described above, the silicon nitride film etching composition according to embodiments of the present invention may maintain a composition ratio even during an etching composition at a high temperature and may stably perform etching.

The silicon nitride film etching composition according to an example embodiment of the present invention may include 60 to 95 wt % of the phosphoric acid; 0.01 to 5.00 wt % of the quaternary ammonium silicate; 0.01 to 5.00 wt % of the silicon compound represented by Chemical Formula 1; and a residual amount of water, with respect to the total weight of the silicon nitride film etching composition.

In terms of significantly decreased occurrence of precipitates and excellent stability of the etching composition during a semiconductor etching process at a high temperature to have a small change in the etch rate and the etch selection ratio, the silicon nitride film etching composition may include, specifically, 60 to 90 wt % of the phosphoric acid; 0.05 to 3.00 wt % of the quaternary ammonium silicate; 0.01 to 3.00 wt % of the silicon compound represented by Chemical Formula 1; and a residual amount of water, more specifically, 75 to 90 wt % of the phosphoric acid; 0.10 to 2.00 wt % of the quaternary ammonium silicate; 0.50 to 2.00 wt % of the silicon compound represented by Chemical Formula 1; and a residual amount of water, and more specifically, 80 to 90 wt % of the phosphoric acid; 0.1 to 1.5 wt % of the quaternary ammonium silicate; 0.8 to 1.5 wt % of the silicon compound represented by Chemical Formula 1; and a residual amount of water.

When the silicon nitride film etching composition satisfying the ranges is used in the etching process, the etch selection for the silicon nitride film relative to the silicon oxide film is excellent, the initial etch rate and etch selection may be maintained even after a repeated etching process, and insoluble materials are not produced during the etching process to perform the etching process stably.

The silicon nitride film etching composition according to an example embodiment of the present invention satisfies the wt % range described above, and also the quaternary ammonium silicate which is a first silicon compound and the silicon compound represented by the following Chemical Formula 1 which is a second silicon compound may be used as a mixture at a weight ratio of 0.01 to 3:1.

As an example, the quaternary ammonium silicate may be used at 1 to 300 parts by weight in the mixture, based on 100 parts by weight of the silicon compound represented by Chemical Formula 1.

As an example, the quaternary ammonium silicate may be used at 5 to 200 parts by weight in the mixture, based on 100 parts by weight of the silicon compound represented by Chemical Formula 1.

As an example, the quaternary ammonium silicate may be used at 10 to 100 parts by weight in the mixture, based on 100 parts by weight of the silicon compound represented by Chemical Formula 1.

In addition, the silicon nitride film etching composition according to an example embodiment of the present invention may further include an inorganic acid, a derivative thereof, or a combination thereof.

As an example, the inorganic acid may be one or produced from a mixture of two or more selected from inorganic acids such as a phosphoric acid, a polyphosphoric acid, a phosphorus acid, a sulfonic acid (e.g., sulfuric acid), a hydrochloric acid, and a hydrofluoric acid, or derivatives of the inorganic acids.

As an example, the polyphosphoric acid may be a polyphosphoric acid in which two molecules or more of phosphoric acids are condensed, and a non-limiting example thereof may include a pyrophosphoric acid, a tripolyphosphoric acid, and the like.

As an example, the derivative of the inorganic acid may be selected from trimethyl phosphate, triethyl phosphate, dimethylmethyl phosphonate, diethyl phosphite, dimethyl phosphonate, trimethylphosphite, diethylamine phosphate, methane sulfonic acid, p-toluene sulfonic acid, benzene sulfonic acid, aminomethyl sulfonic acid, sulfamic acid, and the like.

As an example, the inorganic acid, the derivative thereof, or the combination thereof may be included at 0.05 to 1 wt %, specifically 0.1 to 1 wt %, and more specifically, 0.3 to 0.8 wt %, with respect to the total weight of the silicon nitride film etching composition.

In addition, the silicon nitride film etching composition according to an example embodiment of the present invention may further include an alcoholic solvent. When the alcoholic solvent is added, the density of the silicon nitride film etching composition may be adjusted, and a stable effect may be obtained even at a high temperature of the semiconductor manufacturing process. In addition, even when the silicon nitride film etching composition is used several times, an etch rate change rate for the silicon nitride film is low so that process efficiency is good.

As an example, the alcoholic solvent may be any one or a mixture of two or more selected from the group consisting of methanol, ethanol, propanol, isopropanol, butanol, isobutanol, t-butanol, pentanol, hexanol, heptanol, octanol, ethylene glycol, propylene glycol, tetrahydrofurfuryl alcohol (THFA), and the like.

As an example, the alcoholic solvent may be included at 0.05 to 10 wt %, specifically 0.05 to 5 wt %, and more specifically 0.05 to 3 wt %, with respect to the total weight of the silicon nitride film etching composition.

Water included in the silicon nitride film etching composition according to an example embodiment of the present invention is not particularly limited, but may be deionized water, more specifically deionized water for a process, and may have a resistivity value of 18 MΩ·cm or more.

The silicon nitride film etching composition according to an example embodiment of the present invention has a high selection ratio for a silicon nitride film relative to a silicon oxide film, and has a significant etch rate for the silicon nitride film.

The silicon nitride film etching composition according to an example embodiment of the present invention may have a silicon nitride film/oxide film etching ratio ($E_{SiNx}/E_{SiO2}$) of 500 or more.

As an example, the etch selection ratio ($E_{SiOx}/E_{SiO2}$) may be 700 or more.

As an example, the etch selection ratio ($E_{SiOx}/E_{SiO2}$) may be 900 or more.

As an example according to the present invention, the silicon nitride film etching composition may have an etch rate for the silicon nitride film of 20 to 500 Å/min and an etch rate for the silicon oxide film of 0 to 0.5 Å/min.

As an example, the silicon nitride film etching composition may have an etch rate for the silicon nitride film of 40 to 500 Å/min and an etch rate for the silicon oxide film of 0 to 0.4 Å/min.

As an example, the silicon nitride film etching composition may have an etch rate for the silicon nitride film of 60 to 450 Å/min and an etch rate for the silicon oxide film of 0.05 to 0.35 Å/min.

As an example, since the silicon nitride film etching composition has an improved etching process temperature, the etch rate for the silicon nitride film may be extremely improved.

As an example, when the etching process temperature is 230° C., the etch rate improved by 600% or more as compared with the case at the etching process temperature of 160° C. may be implemented.

In addition, the silicon nitride film etching composition according to an example embodiment of the present invention may have the etch rate drift of the silicon nitride film after a repeated etching process may satisfy the following Relation 1:

$$\Delta ERD_{SiNx} \leq 1\% \qquad \text{[Relation 1]}$$

wherein $\Delta ERD_{SiNx}$ is an etch rate drift relative to an initial etch rate for a silicon nitride film.

The silicon nitride film etching composition has excellent stability to obtain a stable effect even at a high temperature of a semiconductor manufacturing process. In addition, even when the silicon nitride film etching composition is used several times, an etch rate change rate for the silicon nitride film is low so that process efficiency is good.

As an example, in the silicon nitride film etching composition, the etch rate drift of the silicon nitride film ($\Delta ERD_{SiOx}$) depending on an increase in the number of batches may be 0 to 0.9%, more specifically 0.01 to 0.85%, and most specifically 0.1 to 0.8%.

Hereinafter, a method of using the silicon nitride film etching composition according to embodiments of the present invention will be described in detail.

One embodiment of the method according to an example embodiment of the present invention may be a method of selectively etching the silicon nitride film as compared with the silicon oxide film.

Another embodiment may be a manufacturing method of a semiconductor device including an etching process of selectively etching a silicon nitride film.

The silicon nitride film may be various silicon nitride films such as a SiN film, SiON film, and a doped SiN film (doped SiN layer). As a concept including the silicon nitride film, as a specific example, it may refer to film quality which is mainly used as an insulating film when forming a gate electrode and the like. However, it may be used without limitation as long as the technical field has a purpose of selectively etching a silicon nitride film as compared with a silicon oxide film.

In addition, the silicon oxide film is not limited as long as it is a silicon oxide film commonly used in the art, and as an example, may be at least one or more films selected from the group consisting of a spin on dielectric (SOD) film, a high density plasma (HDP) film, a thermal oxide film, a borophosphate silicate glass (BPSG) film, a phosphosilicate glass (PSG) film, a borosilicate glass (BSG) film, a polysilazane (PSZ) film, a fluorinated silicate glass (FSG) film, a low pressure tetraethyl orthosilicate (LP-TEOS) film, a plasma enhanced tetraethyl orthosilicate (PETEOS) film, a high temperature oxide (HTO) film, a medium temperature oxide (MTO) film, an undoped silicate glass (USG) film, a spin on glass (SOG) film, an advanced planarization layer (APL) film, an atomic layer deposition (ALD) film, a plasma enhanced oxide (Pe-oxide) film, an $O_3$-tetraethyl orthosilicate ($O_3$-TEOS) film, and the like. However, these are only a specific example, and the present invention is not limited thereto.

An etching method using the silicon nitride film etching composition according to an example embodiment of the present invention and a manufacturing method of a semiconductor device including the same may selectively etch the silicon nitride film as compared with the silicon oxide film when the silicon nitride film and the silicon oxide film described above are mixed, has a high etch rate, and does not produce precipitates after etching to minimize a defect in the manufacture of a semiconductor device.

In addition, the silicon nitride film etching composition according to embodiments of the present invention has stability at a high temperature, thereby effectively suppressing a phenomenon that a phosphoric acid heated to a high temperature etches the silicon oxide film. Therefore, no precipitate by etching the silicon oxide film may occur to prevent substrate defects, and the silicon nitride film may be selectively etched to implement excellent semiconductor device characteristics.

A method of selectively etching the silicon nitride film as compared with the silicon oxide film, using the silicon nitride film etching composition described above, may be performed by a treatment method commonly used in the art. As a non-limiting example, it may be performed by a method of immersing a substrate in an etching composition solution, a spraying method, or the like.

As an example, the method may be performed at a process temperature of 100° C. or higher, specifically 100 to 500° C., and more specifically 100 to 300° C.

The method may be advantageous for selectively rapidly etching the silicon nitride film as compared with the silicon oxide film and suppressing occurrence of precipitates, when the silicon oxide film, the silicon nitride film, a photoresist film, and the like formed on the substrate are mixed. Thus, according to embodiments of the present invention, an effective oxide film height may be effectively adjusted.

As the substrate, various materials, for example, silicon, quartz, glass, a silicon wafer, a polymer, a metal, a metal oxide, and the like may be used, but the present invention is not limited thereto. As an example of a polymer substrate, a film substrate such as polyethylene terephthalate, polycarbonate, polyimide, polyethylene naphthalate, and a cycloolefin polymer may be used, but is not limited thereto.

The silicon oxide film, the silicon nitride film, and the photoresist film may be formed with a single layer, a double layer, or multiple layers (a multilayer), respectively, but a lamination order is not limited in the case of a double layer or multiple layers.

A manufacturing method of a semiconductor device including an etching process of selectively etching a silicon nitride film, using the silicon nitride film etching composition may be also performed by the method commonly used in the art.

According to the manufacturing method of a semiconductor device, in a semiconductor device on which the silicon nitride film and the silicon oxide film are alternately laminated or mixed, selective etching to the silicon nitride film is possible and damage of the silicon oxide film is effectively suppressed, thereby minimizing damage of the silicon oxide film by etching to greatly improving stability, efficiency, and reliability of a semiconductor device manufacturing process. Here, the type of semiconductor device is not particularly limited in the present invention.

Accordingly, the etching method according to embodiments of the present invention may selectively remove the silicon nitride film as compared with the silicon oxide film and may maintain an etch rate and an etch selection ratio constantly in spite of an increased treatment time, thereby being efficiently applied to a process requiring selective etching of the silicon nitride film. In particular, the etching method according to embodiments of the present invention has suppressed precipitate occurrence and an effect of being excellent in effectively protecting the silicon oxide film, thereby securing stability and reliability of a process.

Hereinafter, the present invention will be described in more detail with reference to the Examples and Comparative Examples. However, the following Examples and Comparative Examples are only an example for describing the present invention in more detail, and do not limit the present invention in any way. Unless otherwise stated, the unit of temperature is ° C., and unless otherwise stated, the unit of an amount of a composition used is wt %.

(Evaluation Method)
1) Measurement of Etch Rate

Specifically, a silicon nitride film (SiN film) wafer and a silicon oxide film wafer were prepared, respectively, by the same deposition as that in a semiconductor manufacturing process by a chemical vapor deposition method. As the silicon nitride film wafer, an LI nitride (thickness: 500 Å) film was used and as the silicon oxide film wafer, a PE-TEOS (thickness: 300 Å) film was used.

An ellipsometer (available from J.A WOOLLAM, M-2000U) which is thin film thickness measuring equipment was used to measure a thickness of the composition before etching. The wafer was immersed in each of the compositions of the following Examples and the Comparative Examples, which was maintained at an etching temperature of 160 to 230° C., for 30 minutes in a bath made of quartz, to proceed with an etching process. After etching was completed, washing is performed using ultrapure water, a drying device was used to completely dry a residual etchant and moisture, and the etch rate was measured.

The etch rate was calculated by dividing a difference in the thicknesses between before etching and after etching by an etching time (minute) using the ellipsometer, and an etch selection ratio calculated therefrom is shown in the following Table 2.

2) Measurement of Etch Rate Drift

A nitride film etch rate of the composition was measured by the method of measuring an etch rate above.

The etching process was set as one batch, and 10 batches were performed by repeating the process without exchange of the silicon nitride film etching composition to measure the etch rate drift ($\Delta ERD_{SiNx}$). The etch rate drift ($\Delta ERD_{SiNx}$) (%) was calculated by the following Equation 1. Here, the initial etch rate is an etch rate of one etching process.

$\Delta ERD_{SiNx}=[1-\{$(etch rate when repeatedly performing etching process n times or more)/(initial etch rate)$\}]\times 100$      [Relation 1]

The results are shown in the following Table 3.

3) Measurement of Whether or not Precipitates Occur

The surface of the silicon oxide film which was etched using the compositions of the following Examples and the Comparative Examples was measured using an electron scanning microscope (SEM) and it was confirmed whether precipitates occurred (○: occurred, ×: not occurred).

The results are shown in the following Table 3.

4) Measurement of Anomalous Growth Occurrence Level (Å) of Silicon Oxide Film

An ellipsometer (available from J.A WOOLLAM, M-2000U) which is thin film thickness measuring equipment was used to measure a difference between a silicon oxide film thickness before etching and a silicon oxide film thickness after etching. Here, a difference in the silicon oxide film thicknesses before and after etching was evaluated as an anomalous growth thickness.

The results are shown in the following Table 3.

Examples 1 to 5, and Comparative Examples 1 to 3

Mixing was performed at the composition ratios described in the following Table 1, and stirring was performed at a speed of 500 rpm for 5 minutes at a room temperature to prepare a silicon nitride film etching composition. 300 g of each of the silicon nitride film etching compositions was prepared, with the content of water being a residual amount to make the total weight 100 wt %.

TABLE 2

| Classification | Etch rate(Å/min) | | Selection ratio |
| | LP Nitride (SiNx) | PE-TEOS (SiO$_2$) | ($E_{SiNx}/E_{SiO2}$) |
| --- | --- | --- | --- |
| Example 1 | 64.3 | 0.04 | 1608 |
| Example 2 | 65.1 | 0.05 | 1302 |
| Example 3 | 65.9 | 0.07 | 941 |
| Example 4 | 445.7 | 0.30 | 1486 |
| Example 5 | 64.1 | 0.05 | 1282 |
| Comparative Example 1 | 71.2 | 3.30 | 22 |
| Comparative Example 2 | 65.8 | 0.05 | 1316 |
| Comparative Example 3 | 62.6 | 1.76 | 36 |

TABLE 3

| Classification | Number of batches | Nitride film etch rate (Å/min) | Nitride film etch rate drift (%) | Oxide film anomalous growth occurrence level (Å) | Whether precipitates occurred |
| --- | --- | --- | --- | --- | --- |
| Example 1 | 1 | 64.3 | — | 0 | x |
| | 10 | 64.0 | 0.47% | 0 | x |
| Example 2 | 1 | 65.1 | — | 0 | x |
| | 10 | 64.7 | 0.61% | 0 | x |
| Example 3 | 1 | 65.9 | — | 0 | x |
| | 10 | 65.4 | 0.76% | 0 | x |
| Example 4 | 1 | 445.7 | — | 0 | x |
| | 10 | 443.9 | 0.40% | 0 | x |
| Example 5 | 1 | 64.1 | — | 0 | x |
| | 10 | 63.9 | 0.31% | 0 | x |
| Comparative Example 1 | 1 | 65.8 | — | 0 | o |
| | 10 | 64.1 | 9.97% | 24 | o |
| Comparative Example 2 | 1 | 62.6 | — | 0 | x |
| | 10 | 60.8 | 7.60% | 11 | o |

TABLE 1

| Classification | Phosphoric acid Content (wt %) | Quaternary ammonium silicate Type | Quaternary ammonium silicate Content (wt %) | Silicon compound Type | Silicon compound Content (wt %) | Water | Process temperature (° C.) |
| --- | --- | --- | --- | --- | --- | --- | --- |
| Example 1 | 85 | A-1 | 0.1 | B-1 | 1 | Residual amount | 160 |
| Example 2 | 85 | A-2 | 0.1 | B-1 | 1 | Residual amount | 160 |
| Example 3 | 85 | A-3 | 0.1 | B-1 | 1 | Residual amount | 160 |
| Example 4 | 85 | A-1 | 1.0 | B-1 | 1 | Residual amount | 230 |
| Example 5 | 85 | A-1 | 1.0 | B-2 | 1 | Residual amount | 160 |
| Comparative Example 1 | 85 | — | — | — | — | Residual amount | 160 |
| Comparative Example 2 | 85 | A-1 | 0.1 | — | — | Residual amount | 160 |
| Comparative Example 3 | 85 | — | — | B-1 | 1 | Residual amount | 160 |

A-1: Tetramethylammonium silicate
A-2: Tetraethylammonium silicate
A-3: Tetrabutylammonium silicate
B-1: (3-Aminopropyl)trimethoxysilane
B-2: A compound of Chemical Formula 1 wherein $R^1$ is aminopropyl, $R^2$ to $R^4$ are hydroxy, $L_1$ is —O—, a is 1, and b is 3.

TABLE 3-continued

| Classification | Number of batches | Nitride film etch rate (Å/min) | Nitride film etch rate drift (%) | Oxide film anomalous growth occurrence level (Å) | Whether precipitates occurred |
|---|---|---|---|---|---|
| Comparative Example 3 | 1 | 64.3 | — | 0 | x |
| | 10 | 64.0 | 0.47% | 9 | x |

As shown in Tables 2 and 3, each of the silicon nitride film etching compositions according to embodiments of the present invention had an excellent initial etch selection ratio of the etching process of 900 or more. In particular, it was confirmed that the silicon nitride film etching composition including quaternary ammonium silicate having fewer carbon atoms such as tetramethylammonium silicate or tetraethylammonium silicate may implement a significantly high etch selection ratio of 1282 to 1608. In addition, in the etching process performed at a higher process temperature, it was confirmed that a more significant etch rate for the silicon nitride film may be implemented.

In addition, it was confirmed that though the silicon nitride film etching composition was reused several times by performing the etching process repeatedly, the etch rate drift for the silicon nitride film was significantly low. Furthermore, in all of the silicon nitride film etching compositions according to embodiments of the present invention, no precipitate occurred even with the repeated performance of the etching process, and the anomalous growth of the silicon oxide film did not occur.

However, the silicon nitride film etching composition of Comparative Examples 1 and 3 had a significantly low initial etch selection ratio of the etching process of 36 or less, which was significantly low as compared with the Examples of the present invention, and in Comparative Example 2, the initial selection ratio for the silicon nitride film was excellent, but as the number of batches was increased, the etch rate drift therefor was increased, so that etching was not stably performed. In addition, when the etching process was repeatedly performed, precipitates occurred in all Comparative Examples, and the etch rate for the silicon oxide film was increased and resorption occurred, whereby anomalous growth in which the thickness of the silicon oxide film was increased occurred.

In summary, according to embodiments of the present invention, the silicon nitride film may be selectively etched with an excellent etch selection ratio, of course, and the etch rate drift is low even with multiple use to maintain initial etching ability, thereby significantly increasing production efficiency. In addition, in the etching process, film quality damage of the silicon oxide film is minimized and also production of precipitates may be effectively suppressed, thereby providing a high-quality semiconductor device.

The silicon nitride film etching composition according to embodiments of the present invention may selectively etch a silicon nitride film as compared with a silicon oxide film. In addition, in a structure in which a silicon nitride film and a silicon oxide film are laminated, the silicon nitride film may be etched with a high selection ratio, and the damage and the etch rate for a silicon oxide film are minimized, thereby allowing stable etching, for example, not causing a collapse of the laminated structure.

In addition, the silicon nitride film etching composition according to embodiments of the present invention does not produce precipitates during etching at a high temperature, and also, does not cause anomalous growth in which the thickness of an oxide film is rather increased.

In addition, since the silicon nitride film etching composition according to embodiments of the present invention has an effect of having a small change in the etch rate and the etch selection ratio for a silicon nitride film, even with an increased etch treatment time or repeated use, productivity in a semiconductor manufacturing process for selectively etching a silicon nitride film may be eventually improved.

In addition, the silicon nitride film etching composition according to embodiments of the present invention may have excellent storage stability and maintain constant etch rate and etch selection ratio for a silicon nitride film even when it is used or stored for a long time.

In addition, the silicon nitride film etching composition according to embodiments of the present invention has an excellent effect of suppressing precipitate occurrence, when used in an etching process and a semiconductor manufacturing process.

It will be apparent to those skilled in the art to which the present invention pertains that the present invention is not limited to the above-mentioned example embodiments, and may be variously substituted, modified, and altered without departing from the scope and spirit of the present invention.

What is claimed is:

1. A silicon nitride film etching composition comprising: a phosphoric acid, a quaternary ammonium silicate, a silicon compound represented by the following Chemical Formula 1, and a residual amount of water:

[Chemical Formula 1]

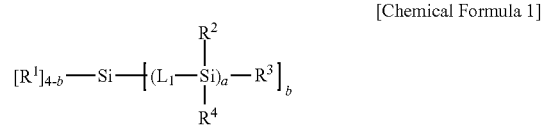

wherein $R^1$ is $C_{1-20}$ aminoalkyl and —$CH_2$— of the alkyl may be replaced with —NR'— or —O— in which R' is hydrogen or $C_{1-7}$ alkyl;

$R^2$ to $R^4$ are independently of one another hydrogen, a halogen, amino, cyano, hydroxy, $C_{1-20}$ alkoxy, $C_{1-20}$ alkyl, $C_{1-20}$ aminoalkyl, or

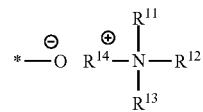

in which $R^{11}$ to $R^{14}$ are independently of one another hydrogen, $C_{1-20}$ alkyl, or $C_{1-20}$ hydroxyalkyl;

$L_1$ is $C_{1-20}$ alkylene and —$CH_2$— of the alkylene may be replaced with —O—, —NR"—, or a combination thereof in which R" is hydrogen or $C_{1-7}$ alkyl;

a is an integer selected from 0 to 10; and b is an integer selected from 1 to 3.

2. The silicon nitride film etching composition of claim 1, wherein in Chemical Formula 1, $R^1$ is $C_{1-7}$ aminoalkyl and —$CH_2$— of the alkyl may be replaced with —NR' in which R' is hydrogen or $C_{1-3}$ alkyl.

3. The silicon nitride film etching composition of claim 2, wherein in Chemical Formula 1, R² to R⁴ are independently of one another hydrogen, a halogen, amino, hydroxy, C₁₋₇ alkoxy, C₁₋₇ alkyl, C₁₋₇ aminoalkyl, or

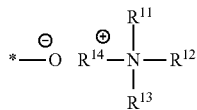

in which R¹¹ to R¹⁴ are independently of one another hydrogen, C₁₋₇ alkyl, or C₁₋₇ hydroxyalkyl; and L₁ is C₁₋₇ alkylene and —CH₂— of the alkylene may be replaced with —O—.

4. The silicon nitride film etching composition of claim 1, wherein in Chemical Formula 1, R¹ is C₁₋₇ aminoalkyl and —CH₂— of the alkyl may be replaced with —NR'— in which R' is hydrogen or methyl;

R² to R⁴ are independently of one another hydrogen, a halogen, hydroxy, or C₁₋₇ alkoxy;

L₁ is —O—; and a is an integer of 0 or 1.

5. The silicon nitride film etching composition of claim 1, wherein the quaternary ammonium silicate is selected from the group consisting of tetramethylammonium silicate, tetraethylammonium silicate, tetrapropylammonium silicate, and tetrabutylammonium silicate.

6. The silicon nitride film etching composition of claim 1, wherein the silicon nitride film etching composition includes 60 to 95 wt % of the phosphoric acid, 0.01 to 5.00 wt % of the quaternary ammonium silicate, 0.01 to 5.00 wt % of the silicon compound represented by Chemical Formula 1, and a residual amount of water, with respect to a total weight of the silicon nitride film etching composition.

7. The silicon nitride film etching composition of claim 6, wherein the silicon nitride film etching composition includes 1 to 300 parts by weight of the quaternary ammonium silicate, based on 100 parts by weight of the silicon compound represented by Chemical Formula 1.

8. The silicon nitride film etching composition of claim 1, further comprising: an inorganic acid, a derivative thereof, or a combination thereof.

9. The silicon nitride film etching composition of claim 1, further comprising: an alcoholic solvent.

10. The silicon nitride film etching composition of claim 1, wherein a silicon nitride film/oxide film etch selection ratio ($E_{SiNx}/E_{SiO2}$) of the silicon nitride film etching composition is 500 or more.

11. The silicon nitride film etching composition of claim 10, wherein an etch rate of the silicon nitride film etching composition for the silicon nitride film is 20 to 500 Å/min, and an etch rate of the silicon nitride film etching composition for the silicon oxide film is 0 to 0.5 Å/min.

12. The silicon nitride film etching composition of claim 11, wherein an etch rate drift of the silicon nitride film after a repeated etching process satisfies the following Relation 1:

$$\Delta ERD_{SiNx} \leq 1\% \qquad \text{[Relation 1]}$$

wherein $\Delta ERD_{SiNx}$ is an etch rate drift relative to an initial etch rate for a silicon nitride film.

13. A method of selectively etching a silicon nitride film as compared with a silicon oxide film, using the silicon nitride film etching composition of claim 1.

14. A manufacturing method of a semiconductor device, the method comprising: an etching process performed using the silicon nitride film etching composition of claim 1.

* * * * *